United States Patent
Jonas et al.

(12)
(10) Patent No.: US 6,391,481 B1
(45) Date of Patent: *May 21, 2002

(54) AUXILIARY LAYERS FOR ELECTROLUMINESCENT ASSEMBLIES

(75) Inventors: Friedrich Jonas, Aachen; Rolf Wehrmann, Krefeld; Andreas Elschner, Mülheim; Helmut-Werner Heuer, Krefeld, all of (DE)

(73) Assignee: Bayer Aktiengesellschaft, Leverkusen (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,926

(22) Filed: Sep. 8, 1999

(30) Foreign Application Priority Data

Sep. 12, 1998 (DE) ......................................... 198 41 803

(51) Int. Cl.⁷ .............................................. H05B 33/14
(52) U.S. Cl. ...................... 428/690; 428/917; 428/704; 428/323; 428/327; 313/504; 313/506; 257/40; 257/103; 252/301.35
(58) Field of Search ................................ 428/690, 917, 428/704, 323, 327; 313/504, 506; 257/40, 103; 252/301.35

(56) References Cited

U.S. PATENT DOCUMENTS

| | | | |
|---|---|---|---|
| 5,093,033 A | 3/1992 | Jonas et al. ................. 252/500 |
| 5,300,575 A | 4/1994 | Jonas et al. ................. 525/186 |
| 5,370,981 A | 12/1994 | Krafft et al. ................ 430/529 |
| 5,399,502 A | 3/1995 | Friend et al. ................... 437/1 |
| 5,498,761 A | 3/1996 | Wessling et al. ............ 427/542 |
| 5,674,597 A | * 10/1997 | Fujii et al. .................. 428/212 |
| 5,719,467 A | 2/1998 | Antoniadis et al. ......... 313/506 |
| 5,766,515 A | 6/1998 | Jonas et al. ................. 252/500 |

FOREIGN PATENT DOCUMENTS

| | | |
|---|---|---|
| DE | 19627071 | 1/1998 |
| EP | 589529 | 3/1994 |
| GB | 1399256 | 7/1975 |
| WO | 98/03499 | 1/1998 |

OTHER PUBLICATIONS

Science, vol. 279, Feb. 20, 1998, pg 1135, "Your (Light–Emitting) Logo Here".

D. Braun, Synthetic Metals 92, (Month unavailable), 1998, pp. 107–113 "Crosstalk In Passive Matrix Polymer LED Displays".

Synthetic Metals, 87, 171(1997), XP002127849, Seite 171, Spalte 2, Absätze 2, 3; Seite 172, Spalte 1, Absatz 1; Seite 173, Spalte 2, Absatz 2.

Advanced Materials, 7, 788(1995), XP000520462, Seite 788, Spalte 1, Absatz 3; Seite 788, Spalte 2, Absatz 2; Seite 789, Spalte 1, Absatz 1; Seite 789, Spalte 2, Absatz 4.

Nature, 357,477 (1992), XP002127850, Seite 477, Spalte 1; Seite 477, Spalte 2, Absätze 4,5; Seite 479, Spalte 1, Absätze 1,2.

Synthetic Metals, 82, 221 (1996), XP002127851, Seite 221, Spalte 2, Absatz 3; Seite 222, Spalte 2, Absatz 2.

* cited by examiner

*Primary Examiner*—Cynthia H. Kelly
*Assistant Examiner*—Ling Xu
(74) *Attorney, Agent, or Firm*—Joseph C. Gil; Richard E. L. Henderson; Diderico van Eyl

(57) ABSTRACT

The invention relates to an electroluminescent assembly containing, as hole injection layer, a polymeric organic conductor that has been applied either from solution or from a dispersion and contains particles having a particle size of less than 1 μm.

7 Claims, No Drawings

AUXILIARY LAYERS FOR ELECTROLUMINESCENT ASSEMBLIES

BACKGROUND OF THE INVENTION

The invention relates to electroluminescent assemblies containing conductive polymers as auxiliary layers.

An electroluminescent ("EL") assembly is characterized by the emission of light and the flow of electric current when an electric potential is applied. Such assemblies have long been known in industry under the name light emitting diodes ("LEDs"). The emission of light occurs as a result of positive charges (holes) and negative charges (electrons) combining with emission of light.

The LEDs customary in industry mostly comprise inorganic semiconductor materials. However, EL assemblies for which the essential constituents are organic materials have been known for some years. These organic EL assemblies generally contain one or more layers of organic charge transport compounds.

The general layer structure is as follows, where the numbers 1 to 10 have the following meanings:
1. Support, substrate
2. Base electrode
3. Hole injection layer
4. Hole transport layer
5. Emitter layer
6. Electron transport layer
7. Electron injection layer
8. Top electrode
9. Contacts
10. Envelope, encapsulation This structure represents the most general case and can be simplified by leaving out individual layers, in which case at least one of the remaining layers assumes a plurality of functions. In the simplest case, an EL assembly comprises two electrodes between which an organic layer fulfills all functions, including the emission of light. Such systems are described, for example, in the PCT patent application WO-A 90/13148 on the basis of poly[p-phenylene-vinylene].

In the production of large-area, electroluminescent display elements, at least one of the electrodes 2 or 8 that supply electric power must consist of a transparent and conductive material.

Suitable substrates 1 are transparent supports such as glass or films of plastic such as polyester, for example, polyethylene terephthalate or polyethylene naphthalate, polycarbonate, polyacrylate, polysulfone, or polyimide.

Suitable transparent and conductive materials are
(a) metal oxides, for example, indium-tin oxide ("ITO") and tin oxide ("NESA");
(b) semitransparent metal films of, for example Au, Pt, Ag, Cu, and the like.

Suitable emitter layers 5 are described in DE-A 19,627,071. However, in practice it has been found that electron injection or hole injection layers (3,4 and/or 6,7) must be incorporated into the electroluminescent assemblies to increase the light flux. EP-A 686,662 discloses the use of specific mixtures of conductive organic polymers, such as 3,4-polyethylenedioxythiophene and polyhydroxy compounds or lactams, as electrode 1 in ELP assemblies. However, in practice it has been found that these electrodes have insufficient conductivity, particularly for large-area displays.

DE-A 19,627,071 discloses the use of polymeric organic conductors, for example, 3,4-polyethylenedioxythiophene, as hole injection layers. By this means, the light flux of the electroluminescent displays can be increased considerably compared with assemblies not having intermediate, organic polymer layers. However, the life of these displays is still not sufficient for practical applications.

It was an object of the present invention to increase the life of ELP assemblies based on organic materials.

It has now surprisingly been found that the life of electroluminescent displays to be increased considerably by using a solution or dispersion of polymeric organic conductors having a very small particle size and, if conductive polymers of the formula (I) are used, a specific ratio of the conductive polycations to nonconductive counterions or nonionic binders. It has also been found that the occurrence of short circuits between the two conductive electrodes 2 and 8 can be significantly reduced in this way.

SUMMARY OF THE INVENTION

The present invention relates to an electroluminescent assembly containing, as hole injection layer, a polymeric organic conductor that has been applied either from solution or from a dispersion and contains particles, even in any swollen state, having a particle size of less than 1 μm (preferably less than 0.5 μm, particularly less than 0.25 μm).

DETAILED DESCRIPTION OF THE INVENTION

Suitable polymeric organic conductors are substituted or unsubstituted polyfurans, polypyrroles, polyanilines or polythiophenes. Such compounds are described, for example, in EPA 2,257,573 (polyalkoxythiophenes), WO-A 90/04256 (polyanilines), EP-A 589,529 (polypyrrole), and DE-A 2,262,743 (oligoanilines). Particularly suitable polymeric organic conductors are uncharged or cationic, soluble or insoluble alkylene-dioxythiophenes of the formula (I)

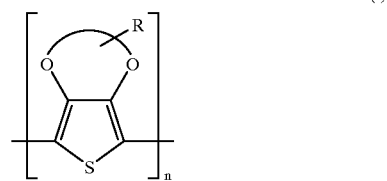

(I)

wherein
n represents an integer from 5 to 100 and
R represents H, a substituted or unsubstituted alkyl radical having from 1 to 20 carbon atoms, —CH$_2$—OH, or an aryl radical having 6 to 14 carbon atoms.
Examples of particularly suitable alkylenedioxythiophenes are described in EP-A 440,957 and DE-A 4,211,459.

Polymeric organic conductors that are likewise particularly suitable are uncharged or cationic, soluble or insoluble polythiophenes of the general formula (II)

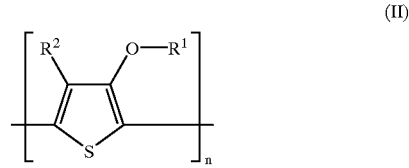

(II)

wherein n represents an integer from 5 to 100, $R^1$ represents —$(CH_2)_m$—$SO_3M$, where M is Li, Na, K, Rb, Cs, $NH_4$, or H, $R^2$ represents H or an alkyl group having from 1 to 12 carbon atoms, and m represents an integer from 1 to 12.

The preparation of these polythiophenes is described in WO-A 98/03499.

Polythiophenes of the formulas (I) and (II) can be used alone or as a mixture.

Particular preference is given to conductive polymers of the formula (I) in combination with polyanions, such as are described, for example, in EP-A 440,957. Particularly suitable solutions or dispersions of conductive polymers are obtained when less than 0.4 part by weight (particularly less than 0.3 part by weight), based on one part by weight of polyanion, of the conductive polymer of the formula (I) is present.

This ratio of conductive polymer to polyanion can be set directly in the preparation. However, it has been found that it is also possible to start from a solution or dispersion containing a higher proportion of conductive polymer and to set the ratio of conductive polymer to polyanion according to the invention only subsequently by addition of salts of the polyanions or free acids of the polyanions.

In addition, these preferred solutions or dispersions have the advantage that the conductivity of the layer is less than that obtained using a solution or dispersion having a ratio of the polythiophene of the formula (I) to polyanion of 0.4:1. This reduces the "cross talk" (see Braun in *Synth. Metals*, 92, 107–113 (1998)) in electroluminescent matrix displays. For this reason, preference is given to using solutions or dispersions that lead to layers having a surface resistance of $>10^5$ Ω/□ measured at a dry film thickness of 75 nm or layers having a conductivity of <2 S/cm.

The electroluminescent assembly of the invention is produced by means of technologies that are basically known. To produce the intermediate layers 3 in the systems of the invention, a solution or dispersion of the polythiophene is distributed as a film on the base electrode. Solvents used are preferably water or water/alcohol mixtures. Suitable alcohols are, for example, methanol, ethanol, propanol, isopropanol, and butanol. The use of these solvents has the advantage that further layers can be applied from organic solvents such as aromatic or aliphatic hydrocarbon mixtures without layer 3 being attacked.

The solutions or dispersions of the polymeric organic conductor are preferably filtered through a filter, for example, a membrane filter from Millipore, having a pore size of <1 μm prior to the coating step. Preference is given to using <0.5 μm filters, and particular preference is given to using <0.25 μm filters.

It is also possible to add organic polymeric binders and/or organic low molecular weight crosslinkers to the solutions or dispersions of the polymeric organic conductors. Appropriate binders are described, for example, in EP-A 564,911.

Preference is given to using solutions or dispersions of the polymeric organic conductors which contain less than 10 ppm of metal ions and/or less than 10 ppm of anions of inorganic acids. Particular preference is given to using solutions or dispersions of the polymeric organic conductors that contain less than 1 ppm of metal ions and/or less than 1 ppm of anions of inorganic acids.

The solution or dispersion of the polymeric organic conductor is uniformly distributed on the substrate using techniques such as spin coating, casting, doctor blade coating, printing, or curtain casting. The layers are subsequently dried at room temperature or at temperatures up to 300° C. (preferably up to 200° C.).

The solution or dispersion can also be applied in structured form, preferably by printing techniques such as ink jet printing. This technique is described for water-soluble polythiophenes in, for example, *Science*, Vol. 279 (1998).

It has been found that when use is made of supports for which the full area has been coated with indium-tin oxide and to which the conductive polymer layer has been applied in structured form, the emitter layer that is subsequently likewise applied over the full area emits light only at the places that are coated with conductive polymer. This method makes it possible to produce structured electroluminescent displays in a simple way without structuring of the conductive base electrode.

The thickness of the intermediate layer 3 according to the invention is from about 3 to 500 nm (preferably from 10 to 200 nm).

Subsequently, the further layers are applied by deposition from solution or by vapor deposition to the intermediate layer 3 produced according to the invention. Preference is given to using poly-para-phenylene-vinylene derivatives or aluminum complexes such as aluminum quinolate as emitter layer 5. When using poly-para-phenylene-vinylene derivatives, the additional hole injection layer 4 can advantageously be omitted.

The electroluminescent displays produced according to the invention are notable for a long life, a high light flux, and low voltages in use.

The invention is further illustrated but is not intended to be limited by the following examples in which all parts and percentages are by weight unless otherwise specified.

EXAMPLES

Comparative example

Filtration test on Baytron® P (3,4-Polyethylenedioxythiophene/polystyrene-sulfonate Dispersion (PEDT/PSS 1:2.5) (Bayer AG)

The Baytron® P dispersion could not be filtered through a 0.45 μm membrane filter from Millipore. The dispersion was therefore used without filtration to produce electroluminescent displays.

Example 1

Preparation of the 3,4-Polyethylenedioxythiophene/polystyrenesulfonate Dispersion (PEDT/PSS 1:4)

20 g of free polystyrenesulfonic acid ($M_n$ about 40,000), 13.4 g of potassium peroxodisulfate, and 50 mg of iron(II) sulfate were added to 2000 ml of water while stirring. 5.0 g of 3,4-ethylenedioxythiophene were then added while stirring. The dispersion was stirred at room temperature for 24 hours. Subsequently, 100 g of anion-exchange resin Lewatit® MP 62 (Bayer AG) and 100 g of cation-exchange resin Lewatit® S 100 (Bayer AG), both moist with water, were added and the mixture was stirred for 8 hours.

The ion-exchange resins were removed by filtration through a poly-acrylonitrile fabric having a pore size of 50 μm, thereby giving a dispersion having a solids content of about 1.2% by weight that was ready to use.

The dispersion could easily be filtered through a 0.45 μm filter. The filtered dispersion was used for producing electroluminescent displays.

Example 2

Preparation of the 3,4-Polyethylenedioxythiophene/polystyrenesulfonate Dispersion (PEDT/PSS 1:8)

20 g of free polystyrenesulfonic acid ($M_n$ about 40,000), 6.7 g of potassium peroxodisulfate, and 50 mg of iron(III) sulfate were added to 2000 ml of water while stirring. 2.5 g of 3,4-ethylenedioxythiophene were then added while stirring. The dispersion was stirred at room temperature for 24 hours. Subsequently, 100 g of anion-exchange resin Lewatit® MP 62 (Bayer AG) and 100 g of cation-exchange resin Lewatit® S 100 (Bayer AG), both moist with water, were added and the mixture was stirred for 8 hours.

The ion-exchange resins were removed by filtration through a poly-acrylonitrile fabric having a pore size of 50 μm, thereby giving a dispersion having a solids content of about 1.1% by weight that was ready to use.

The dispersion could easily be filtered through a 0.22 μm filter. The filtered dispersion was used for producing electroluminescent displays.

Application Examples

Comparative Application Example I

The following procedure was used for constructing an organic light emitting diode ("OLED") according to the invention:

1. Cleaning the ITO substrate

ITO-coated glass (Merck Balzers AG, Part No. 253 674 XO) was cut into 50 mm.×50 mm pieces (substrates). The substrates were subsequently cleaned for 15 minutes in 3% strength aqueous Mukasol® solutions in an ultrasonic bath. The substrates were then rinsed with distilled water and spun dry in a centrifuge. This rinsing and drying procedure was repeated 10 times.

2. Application of the Baytron P layer to the ITO

The substrate was placed on a spin coater and about 10 ml of the 1.3% strength polyethylenedioxythiophene/polystyrenesulfonic acid solution (Baytron P) were distributed on the ITO-coated side of the substrate. The excess solution was subsequently spun off by rotation of the plate at 500 rpm for 3 minutes. The substrate that had been coated in this way was then dried at 110° C. on a hotplate for 5 minutes. The layer had a thickness of 60 nm (Tencor, Alphastep 200) but was, however, inhomogeneous and contained pinholes.

3. Application of the hole conductor layer 5 ml of a 1.5% strength dichloroethane solution of 1 part by weight of polyvinylcarbazole (BASF Luvican®) and 2 parts by weight of amine A (formula (III) below) were filtered (Millipore® HV, 0.45 μm) and distributed on the dried Baytron P layer. The excess solution was subsequently spun off by rotation of the plate at 800 rpm for 60 seconds. The substrate that had been coated in this way was then dried at 110° C. on a hotplate for 5 minutes. The total layer thickness was 150 nm.

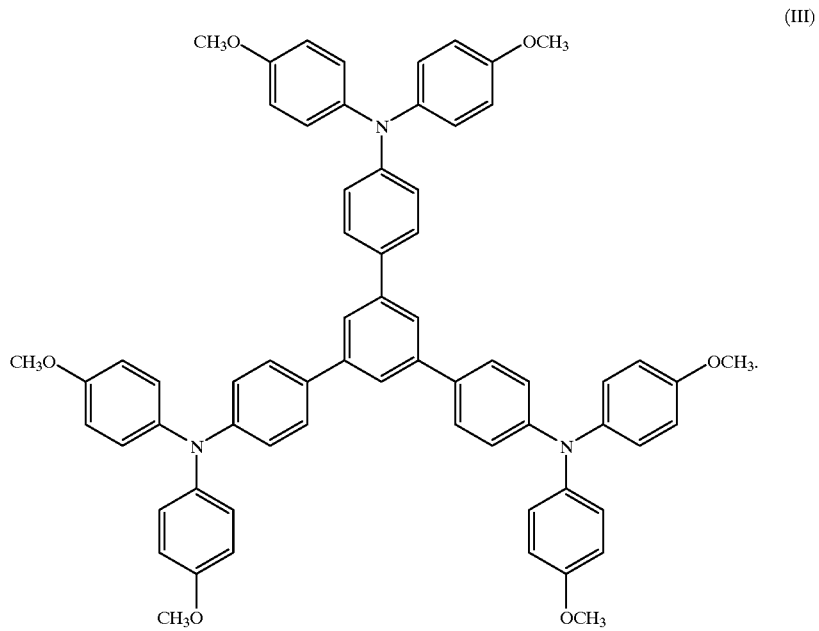

(III)

4. Vapor deposition of the light-emitting/electron-injecting layer

A third organic layer, namely the substance to be used according to the invention, aluminum trishydroxyquinolate, was applied by thermal vapor deposition to the two organic layers produced as described above using a vapor deposition unit (Leybold, Univex350). During vapor deposition, the pressure in the vapor deposition unit was $10^{-3}$ Pa and the deposition rate was 2 Å/sec. The total thickness of the three organic layers was 200 nm.

5. Vapor deposition of the metal cathode

A metal electrode was vapor-deposited onto the organic layer system. For this purpose, the substrate was placed with the organic layer system facing downward on a perforated mask (hole diameter 5 mm). At a pressure of $10^{-3}$ Pa, the elements Mg and Ag were vaporized in parallel from two vaporization boats. The deposition rates were 28 Å/sec for Mg and 2 Å/sec for Ag. The thickness of the vapor-deposited metal contacts was 500 nm.

The two electrodes of the organic LED were connected to a voltage source using electric leads. The positive pole was connected to the ITO electrode and the negative pole was connected to the MgAg electrode.

Application of a voltage resulted in short circuits, so that the electric current and the electroluminescence were not stable over time.

Comparative Application Example 2

The procedure used for the construction of an OLED in Example 1 according to the invention was followed except that an unfiltered poly-ethylenedioxythiophene dispersion from Example 2 was applied by spin coating in place of Baytron P. The following procedure was used for this purpose:

The substrate was placed on a spin coater and about 10 ml of the polyethylenedioxythiophene/polysulfonic acid solution were distributed on the ITO-coated side of the substrate. Subsequently, the excess solution was spun off by rotation of the plate at 500 rpm for 3 minutes. The substrate that had been coated in this way was then dried at 110° C. on a hotplate for 5 minutes. The layer had a thickness of 60 nm (Tencor, Alphastep 200) but was, however, inhomogeneous and contained pinholes.

Application of a voltage resulted in short circuits, so that the electric current and the electroluminescence were not stable over time.

Application Example 1

The procedure used for the construction of an OLED in Example 1 according to the invention was followed except that a solution from Example 1 that had been filtered through a 0.45 µm filter was applied by spin coating. The following procedure is used for this purpose:

The substrate was placed on a spin coater and the filtered solution from Example 1 was distributed on the ITO-coated side of the substrate. Subsequently, the excess solution was spun off by rotation of the plate at 500 rpm for 3 minutes. The substrate that had been coated in this way was subsequently dried at 110° C. on a hotplate for 5 minutes. The layer had a thickness of 60 nm (Tencor, Alphastep 200) and was homogeneous and contains no pinholes.

Above a voltage of only 3 volt, electroluminescence could be detected using a photodiode (EG&G C30809E). A voltage of 10 volt resulted in a current per unit area of 100 mA/cm$^2$ that was stable over time and an electroluminescence intensity of 2500 cd/M$^2$ that was stable over time. The color of the electroluminescence was greenish blue.

What is claimed is:

1. An electroluminescent assembly comprising:
   (a) a base electrode,
   (b) a top electrode, and
   (c) a hole injection layer comprising a polymeric organic conductor applied either from a solution containing particles having a particle size of less than 1 µm or from a dispersion containing particles having a particle size of less than 1 µm,
   wherein the polymeric organic conductor comprises a substituted or unsubstituted, uncharged or cationic 3,4-polyalkylenedioxy thiophene of the formula

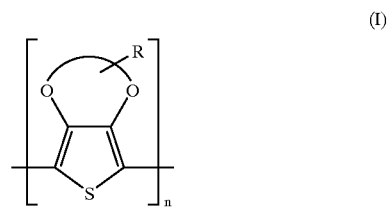

(I)

wherein
n represents an integer from 5 to 100, and
R represents H, a substituted or unsubstituted alkyl radical having from 1 to 20 carbon atoms, —CH$_2$—OH, or an aryl radical having 6 to 14 carbon atoms.

2. The electroluminescent assembly according to claim 1, wherein the hole injection layer has been applied from a dispersion and the particles of the dispersion have a particle size of <0.25 µm.

3. The electroluminescent assembly according to claim 1, wherein the hole injection layer contains <0.4 part by weight of the conductive polythiophene of the formula (I) per one part by weight of polyanion.

4. The electroluminescent assembly according to claim 1, wherein the hole injection layer has a surface resistance of >10$^5$ Ω/□ measured at a dry film thickness of 75 nm.

5. The electroluminescent assembly according to claim 1, wherein the hole injection layer has a conductivity of <2 S/cm.

6. The electroluminescent assembly according to claim 1, wherein the hole injection layer consists essentially of the polymeric organic conductor and wherein each particle of the dispersion or each particle of the solution is less than 1 µm.

7. The electroluminescent assembly according to claim 1, wherein the hole injection layer consists of the polymeric organic conductor and wherein each particle of the dispersion or each particle of the solution is less than 1 µm.

* * * * *